United States Patent
Seth et al.

(10) Patent No.: US 8,415,986 B2
(45) Date of Patent: Apr. 9, 2013

(54) VOLTAGE-MODE DRIVER WITH PRE-EMPHASIS

(75) Inventors: Sumantra Seth, Bangalore (IN); Rajavelu Thinakaran, Bangalore (IN)

(73) Assignee: Texas Instruments Incorporated, Dallas, TX (US)

( * ) Notice: Subject to any disclaimer, the term of this patent is extended or adjusted under 35 U.S.C. 154(b) by 87 days.

(21) Appl. No.: 12/979,337

(22) Filed: Dec. 28, 2010

(65) Prior Publication Data

US 2012/0161816 A1 Jun. 28, 2012

(51) Int. Cl.
*H03B 1/00* (2006.01)
*H03K 3/00* (2006.01)

(52) U.S. Cl.
USPC ............ 327/108; 327/110; 327/111; 326/30; 326/82

(58) Field of Classification Search .................. 327/108, 327/110, 111; 326/30, 82
See application file for complete search history.

(56) References Cited

U.S. PATENT DOCUMENTS

| | | | |
|---|---|---|---|
| 6,704,818 B1 | 3/2004 | Martin et al. | |
| 6,812,733 B1 | 11/2004 | Plasterer et al. | |
| 7,109,759 B2 | 9/2006 | Tseng | |
| 7,408,387 B2 | 8/2008 | Suenaga | |
| 2007/0120582 A1 | 5/2007 | Chung et al. | |
| 2007/0285120 A1* | 12/2007 | Venditti et al. ................ | 326/30 |
| 2010/0301905 A1 | 12/2010 | Kanda | |

OTHER PUBLICATIONS

"Marcel Kossel, Christian Menolfi, Jonas Weiss, Peter Buchmann, George Von Bueren, Lucio Rodoni, Thomas Morf, Thomas Toifl and Martin Schmatz", A T-Coil-Enhanced 8.5Gb/s High-Swing Source—Series-Terminated Transmitter in 65nm Bulk CMOS, Solid-State Circuits Conference, ISSCC 2008. Digest of Technical Papers. IEEE International, Year Feb. 4, 2008, p. 110-111, and 599.
"R. A. Philpott, J. S. Humble, R. A. Kertis, K. E. Fritz, B. K. Gilbert and E. S. Daniel", A 20Gb/s SerDes Transmitter with Adjustable Source Impedance and 4-tap Feed-Forward Equalization in 65nm Bulk CMOS, IEEE Custom Intergrated Circuits Conference (CICC), Year 2008, p. 623-626.
"Christian Menolfi, Thomas Toifl, Peter Buchmann, Marcel Kossel, Thomas Morf, Jonas Weiss and Martin Schmatz", A 16Gb/s Source-Series Terminated Transmitter in 65nm CMOS SOI, IEEE International Solid-State Circuits Conference ISSCC 2007, Year Feb. 14, 2007, p. 446-447 and 614.

* cited by examiner

*Primary Examiner* — John Poos
(74) *Attorney, Agent, or Firm* — Alan A. R. Cooper; Wade J. Brady, III; Frederick J. Telecky, Jr.

(57) ABSTRACT

A voltage-mode driver circuit supporting pre-emphasis includes multiple resistors, and multiple transistors operated as switches. Control signals operating the transistors represent a logic level of an input signal to the driver circuit. To generate a pre-emphasized output, the transistors are operated to connect a parallel arrangement of the resistors between output terminals of the driver and corresponding constant reference potentials. To generate an output in the steady-state, the transistors are operated to connect some of the resistors across the output terminals of the driver, thereby reducing the output voltage. A desired output impedance of the driver, and a desired level of pre-emphasis are obtained by appropriate selection of the resistance values of the resistors. The current consumption of the driver is less in the steady-state than in the pre-emphasis mode.

18 Claims, 4 Drawing Sheets

VOLTAGE-MODE DRIVER WITH PRE-EMPHASIS

BACKGROUND

1. Technical Field

Embodiments of the present disclosure relate generally to data transmission, and more specifically to a voltage-mode driver with pre-emphasis.

2. Related Art

Driver circuits (drivers) are frequently used in data transmission circuits. The inputs to such driver circuits are typically binary data, and the outputs are corresponding voltage or current signals of suitable signal strengths. The signal strengths of the output voltage or current may be designed to have values that ensure reliable and error free (or low error rate) transmission. In addition, driver circuits may be designed to have a controlled output impedance to match the impedance of a transmission path on which the outputs are transmitted. A voltage-mode driver is generally a driver circuit whose output is a voltage signal, the driver circuit being designed as a voltage source.

The output signals of such voltage-mode driver circuits, being typically of square wave shape (having sharp edges), contain frequency components of high frequencies, which may be attenuated by the transmission path, consequently leading to errors in correctly interpreting the signal at a receiver connected to receive the output signal. Pre-emphasis is a technique that is often used to address the problem noted above, and refers to increasing the amplitude of the output signal of a driver circuit immediately following a logic level transition. The amplitude may subsequently be reduced to a desired steady-state level till another logic level transition occurs. The increased amplitude (pre-emphasis, also termed feed-forward equalization or FFE) following logic-level transitions mitigates the adverse effect that a transmission path (which is typically band-limited) may have on the high frequency components of the output signal. Voltage-mode drivers with pre-emphasis may need to be designed for minimal power consumption, and other desirable features.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A driver circuit includes a plurality of switches. The plurality of switches are operable, in response to a first set of values of a set of control signals, to couple a first resistor between a first one of a pair of differential output terminals of the driver circuit and a first one of a pair of constant reference potentials, a fourth resistor between a second one of the pair of differential output terminals and a second one of the pair of constant reference potentials, a second resistor in parallel with the first resistor, and a third resistor in parallel with the fourth resistor. The plurality of switches are operable, in response to a second set of values of the set of control signals, to couple the first resistor between the first one of the pair of differential output terminals and the first one of the pair of constant reference potentials, the fourth resistor between the second one of the pair of differential output terminals and the second one of the pair of constant reference potentials, and a series arrangement of the second resistor and the third resistor between the pair of differential output terminals.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

Example embodiments will be described with reference to the accompanying drawings briefly described below.

The drawing in which an element first appears is indicated by the leftmost digit(s) in the corresponding reference number.

DETAILED DESCRIPTION

Various embodiments are described below with several examples for illustration.

1. Example Device

Figure 1:
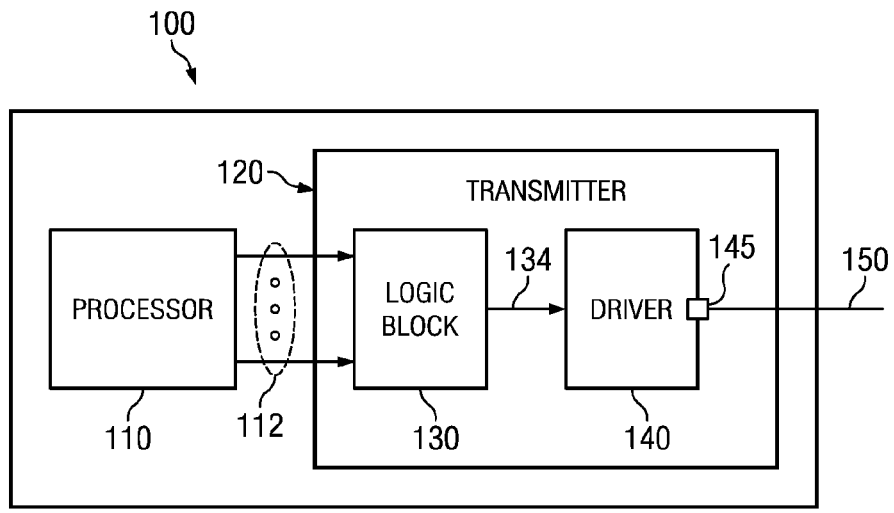
FIG. 1 is a block diagram illustrating the details of an example device in which several embodiments can be implemented.

FIG. 1 is a block diagram of an example device in which several embodiments of the present disclosure can be implemented. USB device 100 is shown containing processor 110 and transmitter 120. USB device 100 may correspond to a USB host, USB hub, USB peripheral, etc. The details of FIG. 1 are meant to be merely illustrative, and real-world implementations may contain more blocks/components and/or different arrangement of the blocks/components. Further, while the description below is provided in the context of a USB device, embodiments of the present disclosure can be deployed in other environments as well, such as, for example, e-SATA (External Serial Advanced Technology Attachment), PCIe (Peripheral Component Interconnect Express), etc. Also, input paths to device 100 are not shown in the interest of conciseness, although such input paths may be present. USB device 100 may be implemented in integrated circuit (IC) form. Alternatively, the elements contained in USB device 100 may be implemented as separate ICs, for example processor 110 as one IC, and transmitter 120 as another IC.

Processor 110 provides data in parallel format to transmitter 120 on path 112. The data may be generated by processor 110 or represent data received from an external component (not shown) and modified by processor 110. The data on path 112 may be consistent with corresponding USB device specifications and formats.

Transmitter 120 is shown containing logic block 130 and driver 140. Logic block 130 receives data in parallel format on path 112 from processor 110, and converts the data into a serial bit stream. The parallel-to-serial conversion in logic block 130 may be performed under control of one or more clocks, as is well-known in the relevant art. Corresponding to each bit in the bit stream, logic block 130 generates control signals on path 134 to enable driver 140 to generate and transmit a signal representing the bit. Although not shown in FIG. 1, a pre-driver circuit contained in logic block 130 may generate such control signals.

Although not shown, USB device 100 may also contain a receiver designed to receive data in serial format from a component or device external to device 100, and to provide the data to processor 110 in parallel format. In such an embodiment, the receiver together with transmitter 120 constitutes a serializer/de-serializer (SERDES). USB device 100 may contain several of such SERDES blocks, although only the transmitter of one of such blocks is shown in FIG. 1.

Terminal 145 represents an output terminal of driver 140, and may correspond to a pad or pin of USB device 100, when implemented as an IC. Path 150 is connected to terminal 145, and may correspond, for example, to a printed circuit board (PCB) trace, flexible cable, etc.

Voltage-mode driver 140 generates, on terminal 145 and path 150, voltage outputs representing logic high and logic low signals (i.e., binary signals) received by transmitter 120 on path 112. The binary signals are generated in response to corresponding values of control signals received on path 134. Path 150 may represent a transmission line, and have a finite bandwidth. The binary signals transmitted on path 150 (ideally) have a square wave (or near-square wave) shape, and therefore have sharp rise and fall edges. The frequency content of the binary signals may, therefore, exceed the bandwidth of path 150. As a result, and as is well-known in the relevant arts, the binary signals may be spread in time, thereby potentially resulting in inter-symbol interference (ISI) in receivers connected to path 150. Hence, the receivers may not be able to reliably interpret the values (logic one/high or logic zero/low) of the signals (signal 150) transmitted on path 150. The extent of ISI, and therefore degradation in reliably interpreting the received values, may vary depending on the specific type of data encoding used. As an illustration, according to Manchester encoding, sharp transitions (bit edges) in the bit stream on path 150 occur at every bit interval. In NRZ (Non Return to Zero) coding, such sharp transitions may occur only when there is a change in the value of bits from a logic one to logic zero or vice versa. With respect to SERDES standards, one of the encoding schemes is termed 8b-10b coding, in which each eight-bit data is mapped to a ten-bit data in such a way that a logic transition is guaranteed every five bits.

According to one technique used to address the problem noted above, signal strength (e.g., voltage levels) of the bit stream on path 150 are increased (pre-emphasized) at every bit edge of concern. Bit edges of concern generally depend on the specific encoding scheme used. Assuming bipolar NRZ (Bipolar Non Return to Zero) is used, a bit stream with pre-emphasis applied at logic value boundaries is shown in FIG. 2.

Figure 2:
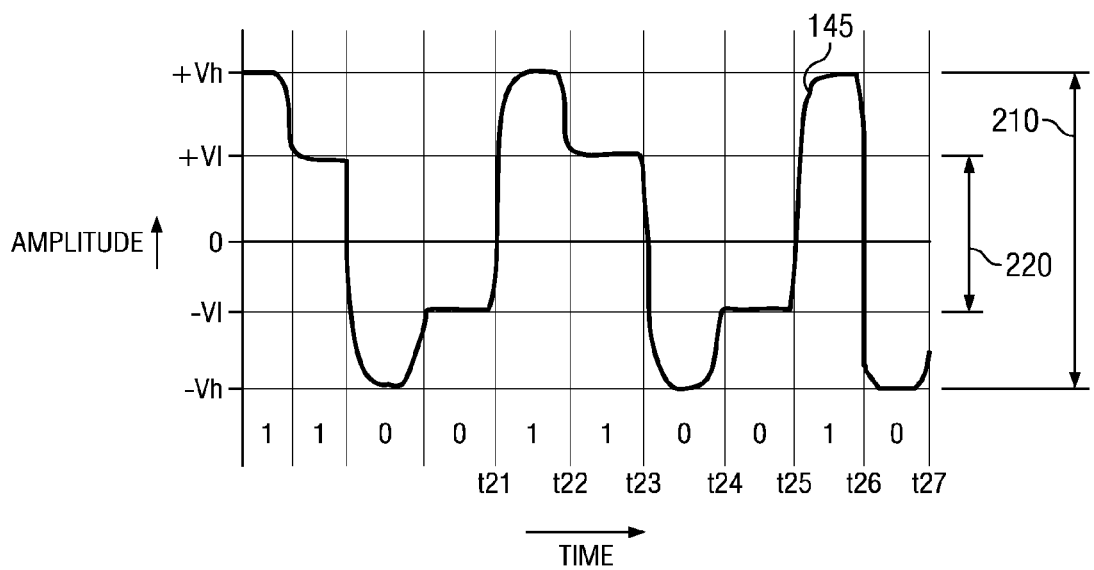
FIG. 2 is a waveform illustrating voltage levels during pre-emphasis and steady-state of a driver in an embodiment.

The bit stream in FIG. 2 is assumed to represent the binary sequence 1100110010. Voltage levels of logic one and logic zero are shown pre-emphasized for one bit-duration following a transition between a logic zero and logic one. To illustrate, at t21, a transition from logic zero to logic one occurs. Hence, the voltage value representing the following logic one is pre-emphasized, and has a voltage level (ideally) equal to +Vh for the duration t21-t22, i.e., one bit period. Interval t22-t23 represents a "steady-state" mode where there is no change in the logic value of the bit stream. At t22, the voltage level used to represent signal 150 changes from the high voltage level +Vh (used to represent pre-emphasized logic one durations) to a steady-state voltage level +Vl. The voltage level representing signal 150 is maintained at +Vl till a logic level transition occurs, as shown in FIG. 2 at t23, when signal 150 transitions from a logic one to a logic zero.

Similarly, voltage levels of signal 150, immediately following logic one to logic zero transitions are shown pre-emphasized. To illustrate, at t23, a transition from a logic one to a logic zero occurs. Hence, the voltage value representing the following logic zero is pre-emphasized, and has a voltage level (ideally) equal to −Vh for the duration t23-t24. Interval t24-t25 represents a steady-state condition where there is no change in the logic value of the bit stream. The voltage level representing signal 150 is maintained at −Vl till a logic level transition occurs, as shown in FIG. 2, at t25. At t25, a logic transition to logic one occurs and the voltage value corresponding to the logic one bit in interval t25-t26 is pre-emphasized. At t26, a logic transition to logic zero occurs and the voltage value corresponding to the logic zero bit in interval t26-t27 is also pre-emphasized.

It is noted that, alternatively, the steady-state levels (+Vl and −Vl) may instead be viewed as a de-emphasized level, and the pre-emphasized levels (+Vh and −Vh) may instead be viewed as the 'normal' level.

2. Driver

Figure 3:
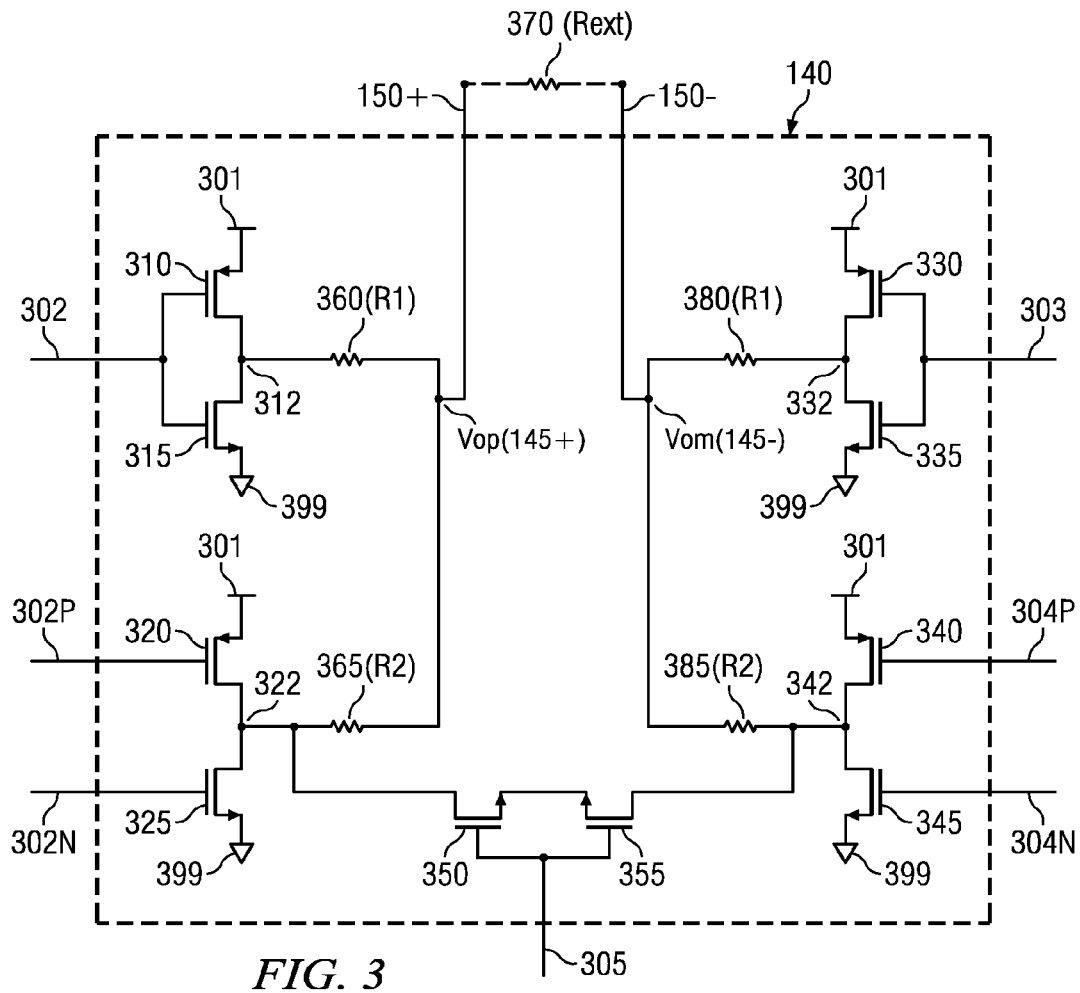
FIG. 3 is a circuit diagram illustrating the implementation details of a driver in an embodiment.

FIG. 3 is a circuit diagram illustrating the implementation details of driver 140 in an embodiment. Voltage mode driver 140, shown implemented to generate a differential output, is shown containing P-type metal oxide semiconductor transistors (PMOS) 310, 320, 330 and 340, N-type metal oxide semiconductor transistors (NMOS) 315, 325, 335 and 345, resistors 360 (first resistor), 365 (second resistor), 380 (third resistor) and 385 (fourth resistor), and NMOS transistors 350 and 355. Terminals 301 and 399 respectively represent power supply (first reference potential) and ground terminals (second reference potential). Vop (145+) and Vom (145−) represent the differential output terminals of driver 140, and correspond to terminal 145 of FIG. 1.

Resistor 370 (Rext) represents a far-end line termination (typically provided at a receiver end) used for impedance matching to minimize reflections. In an embodiment, resistances of resistors 360 and 380 are each equal to a value R1, and resistances of resistors 365 and 385 are each equal to a value R2. The values R1 and R2 may be chosen to provide a desired value of output impedance of driver 140. Control signals (set of control signals) 301, 302P, 302N, 303, 304P, 304N, and 305 are generated by logic block 130 of FIG. 1 (or a pre-driver circuit contained in logic block 130), and are assumed to be contained in path 134 of FIG. 1. Transistors 350 and 355 are controlled to be ON or OFF by control signal 305.

Transistors 310 and 315 are connected in a CMOS inverter configuration, and receive a control signal 301. The logic level of control signal 301 determines whether node 312 is pulled to logic high or logic low. Transistors 320 and 325 are controlled to ON or OFF by respective control signals 302P and 302N. Transistors 330 and 335 are connected in a CMOS inverter configuration, and receive a control signal 303. The logic level of control signal 303 determines whether node 332 is pulled to logic high or logic low. Transistors 340 and 345 are controlled to ON or OFF by respective control signals 304P and 304N. Transistors 310, 315, 320, 325, 330, 335, 340 and 345 are operated as switches by the corresponding ones of control signals 301, 302, 303 and 304. In the description below, it is assumed that ON resistances of transistors 310, 315, 320, 325, 330, 335, 340, 345, 350 and 355 equal zero ohms.

In operation, corresponding ones of transistors (switches) 310, 315, 320, 325, 330, 335, 340 and 345 are controlled to be switched ON or OFF to generate a desired value of differential voltage across output terminals 145+ and 145−.

When pre-emphasis is to be provided (i.e., in a pre-emphasis mode or first mode), a parallel arrangement of resistors 360 and 365 is connected between terminal 145+ and either power supply terminal 301 or ground terminal 399 and a parallel arrangement of resistors 385 and 380 is connected between terminal 145− and either power supply terminal 301 or ground terminal 399. Control signal 305 is at logic low. Whether the connection of one junction of the parallel arrangement of the resistors is made to power supply terminal 301 or ground 399 depends on whether a (differential) logic one or logic zero is to be generated across terminals 145+ and 145−, as illustrated below. In an embodiment, pre-emphasis is provided immediately following each bit transition, and for a duration (pre-emphasis interval) of one bit period, as illustrated in FIG. 2. However, in other embodiments, the pre-emphasis interval may be longer or shorter than a one-bit period. The values of the set of control signals (301, 302P, 302N, 303, 304P, 304N, and 305) in the pre-emphasis mode of operation of driver 140 corresponds to a 'first set of values' and specifies both a voltage level (i.e., pre-emphasized voltage level) as well as a logic level (logic high or logic low) with which output across terminals 145+/145− is to be provided, as illustrated below with respect to FIG. 4A.

In a steady-state (steady-state mode or second mode), switches 310, 315, 320, 325, 330, 335, 340, 345, 350 and 355 are controlled such that resistor 360 is connected between terminal 145+ and either power supply terminal 301 or ground terminal 399, resistor 380 is connected between terminal 145− and either power supply terminal 301 or ground terminal 399, and resistors 365 and 385 are connected in a series arrangement between terminals 145+ and 145−. Whether the corresponding ones of terminals of resistor 360 and resistor 380 are connected to power supply terminal 301 or ground 399 depends on whether a (differential) logic one or logic zero is to be generated across terminals 145+ and 145−. Control signal 305 is at logic high. In an embodiment, 'steady-state' corresponds to a duration (steady-state interval) following a one-bit interval after a logic level transition, and lasts till a next logic level transition, as also illustrated in FIG. 2. However, in other embodiments, the steady-state interval may be longer or shorter than that noted above. The values of the set of control signals (301, 302P, 302N, 303, 304P, 304N, and 305) in the steady-state mode of operation of driver 140 corresponds to a 'second set of values' and specifies both a voltage level (i.e., non-pre-emphasized or steady-state level) as well as a logic level (logic high or logic low) with which output across terminals 145+/145− is to be provided, as illustrated below with respect to FIG. 4B.

Figure 4A:
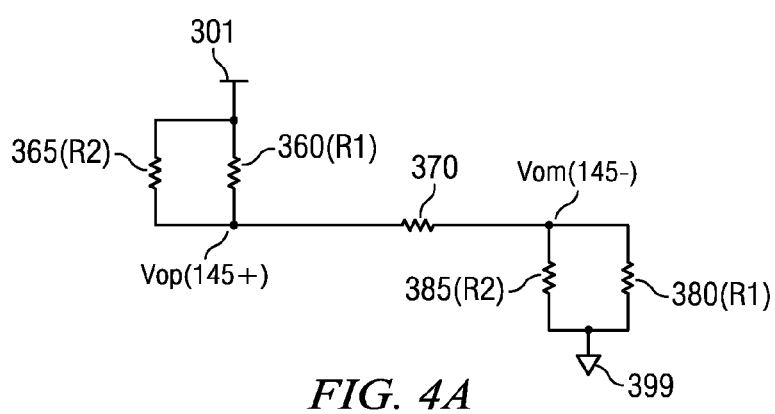
FIG. 4A is an equivalent circuit diagram of a driver when a pre-emphasized logic one is generated by the driver, in an embodiment.

FIG. 4A is an equivalent circuit diagram of driver 140 when a logic one is generated across terminals 145+ and 145− immediately following a transition from a logic zero, i.e., corresponding to pre-emphasized logic one output. Control signal 305 is at logic low, and transistors 350 and 355 are each OFF. Control signal 301 is at logic low, transistor 310 is ON, transistor 315 is OFF, and resistor 360 is connected between terminals 301 and 145+. Control signal 302P and 302N are both at logic low, transistor 320 is ON, transistor 325 is OFF, and resistor 365 is connected between terminals 301 and 145+. Resistors 360 and 365 are thus connected in a parallel arrangement between terminals 301 and 145+. Control signal 303 is at logic high, transistor 335 is ON, transistor 330 is OFF, and resistor 380 is connected between terminals 399 and 145−. Control signal 304P and 304M are each at logic high, transistor 345 is ON, transistor 340 is OFF, and resistor 385 is connected between terminals 399 and 145−. Resistors 380 and 385 are thus connected in a parallel arrangement between terminals 301 and 145−.

In an embodiment, the output impedance (also termed looking-in impedance, looking into driver 140 from output terminal 145+/145−) of driver 140 is set to 50 ohms, corresponding to a value of resistor 370 (Rext) of 100 ohms. For a looking-in impedance of 50 ohms, the equivalent resistance of the parallel arrangement of resistors 365 and 360 (or 385 and 380) equals 50 ohms, as specified below in Equation 1:

$$(R1*R2)/(R1+R2)=50 \qquad \text{Equation 1}$$

Current drawn from power supply 301 is specified by Equation 2 below:

$$I\text{pre}=Vdd/[R\text{ext}+\{(2*R1*R2)/(R1+R2)\}] \qquad \text{Equation 2}$$

wherein,

Ipre is the current drawn from supply 301,

Vdd is the power supply voltage 301,

Rext represents the resistance of resistor 370, and the other terms of Equation 2 are as defined above.

Voltage across terminals 145+ and 145− is specified by Equation 3 below:

$$Vop-Vom=(I\text{pre}*R\text{ext}) \qquad \text{Equation 3}$$

In the embodiment, power supply voltage 301 has a value of one volt (V), and driver 140 is designed to provide 6 dB of pre-emphasis. Corresponding to the above values, Ipre equals 5 milli Amperes (mA), and Vop−Vom equals 0.5 V, corresponding to a peak-to-peak differential swing of output 145+/145− of 1V.

For a pre-emphasized logic zero of output 145+/145−, control signals 301 and 302 are each at logic high, while control signals 303 and 304 are each at logic zero. Hence, the parallel arrangement of resistors 385 and 380 is connected between terminal 145− and power supply terminal 301, and the parallel arrangement of resistors 365 and 360 is connected between terminal 145+ and ground terminal 399. The voltage across terminals 145+ and 145−, therefore, equals −0.5V, for the component values noted above. Hence, a differential peak-to-peak voltage swing of output 145+/145− equals 1V, and corresponds to the swing level indicated by arrow 210 in FIG. 2.

Figure 4B:
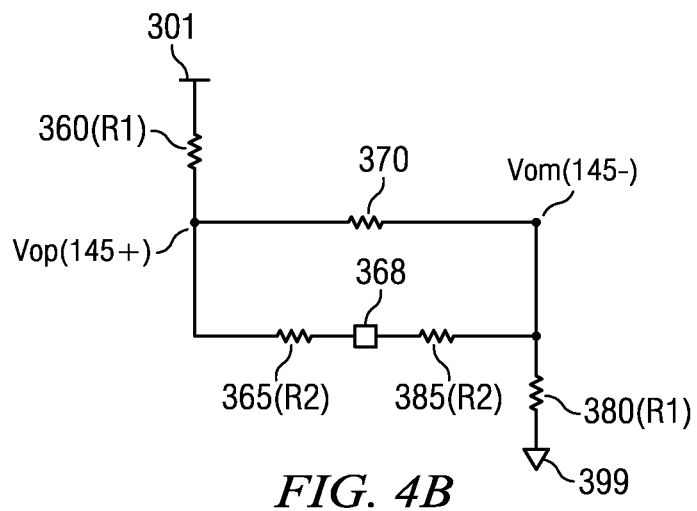
FIG. 4B is an equivalent circuit diagram of a driver when a logic one is generated by the driver in steady-state, in an embodiment.

FIG. 4B is an equivalent circuit diagram of driver 140 when a logic one corresponding to a steady-state is generated across terminals 145+ and 145−. Control signal 305 is at logic one, and transistors 350 and 355 are each ON. Control signals 301 and 303 are respectively logic zero and logic one. Hence, resistor 360 is connected between terminals 301 and 145+, and resistor 380 is connected between terminals 399 and 145−.

Control signals 302P and 302N are respectively at logic one and logic zero, and each of transistors 320 and 325 is OFF. Control signals 304P and 304N are respectively at logic one and logic zero, and each of transistors 340 and 345 is OFF. Control signal 305 is at logic one. As a result, resistors 365 and 385 are connected in series between terminals 145+ and 145−, as shown in FIG. 4B. Node 368 represents AC ground (or a common-mode terminal). Hence, the looking-in impedance from terminals 145+/145− is determined by the parallel combination of resistances R1 and R2, and equals 50 ohms in the embodiment. Since, in the embodiment, driver 140 is designed to provide 6 dB of pre-emphasis, Vop−Vom in the steady-state should equal 0.25V. Rext equals 100 ohms, and Vdd equals 1V, as noted above.

From the circuit of FIG. 4B, the following equation is obtained:

$$\frac{Vop - Vom}{Vdd - (Vop - Vom)} = \frac{Rext * 2 * R2}{(2 * R1) * (Rext + (2 * R2))} \qquad \text{Equation 4}$$

Based on the values of Rext, (Vop−Vom) and Vdd noted above, the following equation is obtained:

$$R1 = \frac{150 * R2}{50 + R2} \qquad \text{Equation 5}$$

From equations 1 and 5, the values of each of R1 and R2 are obtained as 100 ohms.

Current drawn from power supply 301 is specified by Equation 4 below:

$$Iss = Vdd/[2R1 + \{(Rext*2*R2)/(Rext+(2*R2))\}] \qquad \text{Equation 6}$$

wherein,

Iss is the current drawn from supply 301, and the other terms of Equation 4 are as defined above.

Corresponding to the values of Rext, Vdd, R1 and R2 as noted above, Iss equals 3.75 mA.

The value of (Vop−Vom) of 0.25 V corresponds to a peak-to-peak differential swing (indicated by arrow 220 in FIG. 2) of output 145+/145− of 0.5V.

In the steady-state, for a logic zero output across terminals 145+ and 145−, control signals 301 and 303 are respectively at logic one and logic zero. Hence, resistor 360 is connected between terminals 399 and 145+, and resistor 380 is connected between terminals 301 and 145−. Control signals 302P and 302N are respectively at logic one and logic zero, and control signals 304P and 304N are respectively at logic one and logic zero. Control signal 305 is at logic one. As a result, resistors 365 and 385 are connected in series between terminals 145+ and 145−.

It may be observed from the description above that current consumption in the steady-state mode of operation of driver 140 is less than the current consumption in the pre-emphasis mode of operation. As a result, power consumption of driver 140 in the steady state mode of operation is less than some other techniques in which current consumption is greater in the steady-state mode than in the pre-emphasis mode. It is noted that the steady-state level durations of the output of driver 140 may be longer than the pre-emphasis durations, on an average. Hence, the lower power consumption of driver 140 in the steady-state mode may be desirable. Further, the current consumption of the circuit of FIG. 3 reduces with reduction in logic-level swing of output 145+/145−, i.e., lower the output logic-level swing, lower is the power consumption of driver 140.

The difference in the values of currents in the pre-emphasis and steady-state modes is not very large. Such current-difference (ripple current) being relatively small, the value of decoupling capacitance to be provided across power supply 301 and ground 399 may also be correspondingly small. The specific pre-emphasis output voltage swing with respect to the steady state output voltage swing (i.e., the degree of pre-emphasis) can be varied by appropriate selection of resistors 360, 365, 380 and 385. Power consumption of driver 140 is in direct proportion to the value of the output voltage (voltage across output 145+ and 145−) in both the steady-state and the pre-emphasis state.

Figure 6:
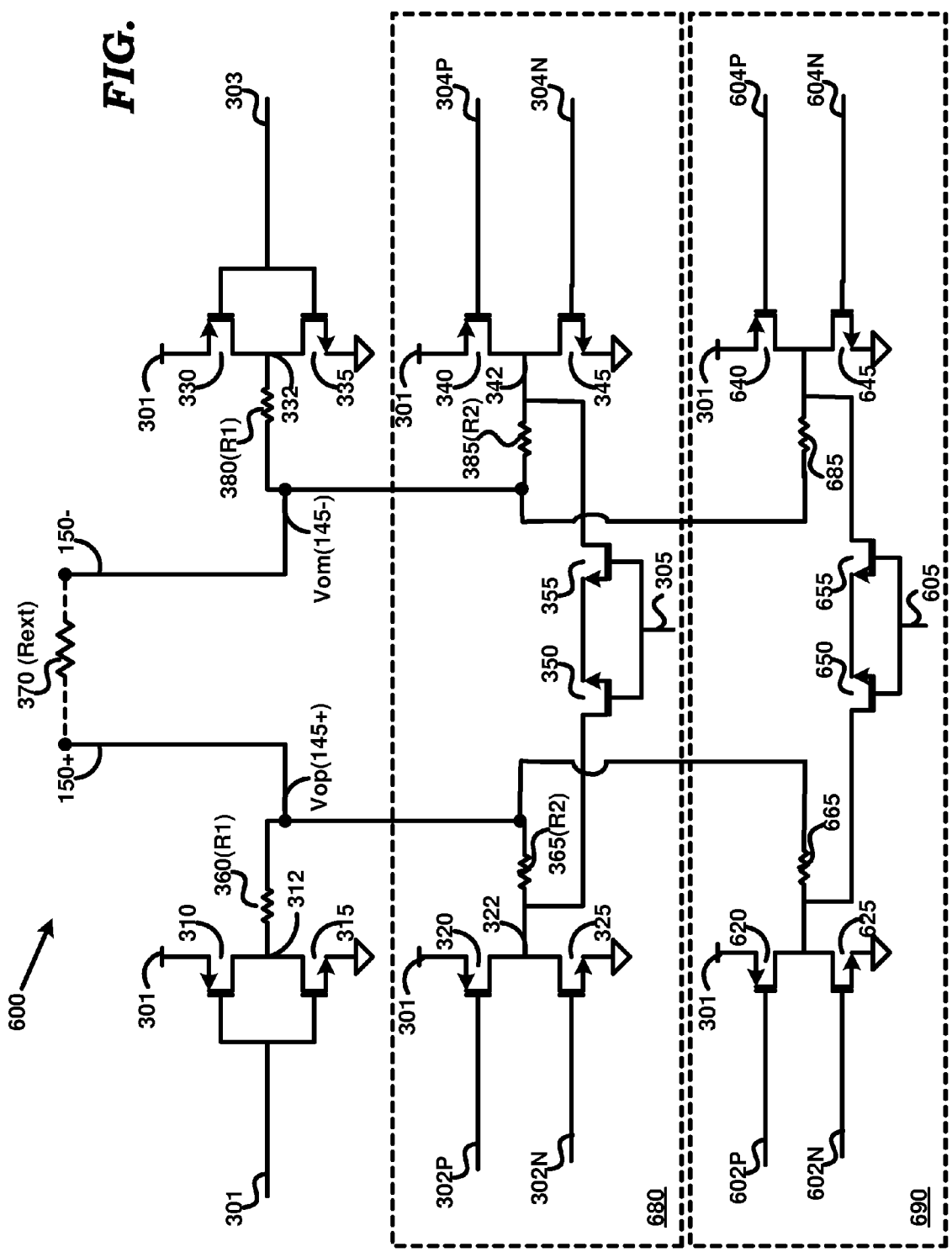
FIG. 6 is a circuit diagram illustrating the implementation details of a driver in an embodiment in which the level of pre-emphasis is selectable between two values.

It is noted here that standards like PCIe specify multiple output logic-level swings to be supported (for e.g., 1V, 0.7V, 0.5, 0.3, 0.15V differential peak-to-peak). By addition of corresponding circuit portions (similar to those shown) to the circuit of FIG. 3 can be implemented to realize any of such multiple output logic-level swings, and not just for de-emphasis. One technique for providing such multiple output logic-level swings can be realized for example, by adding resistor arms similar to those formed by resistor 365, transistors 320 and 325, and resistor 385, transistors 340 and 345, with corresponding control signals. The required output levels can then be obtained by switching the corresponding resistor arm in parallel with resistors 360 and 380 in the pre-emphasis mode and in series in the steady-state mode. An example embodiment containing such an additional arm is shown in FIG. 6. Driver 600 is shown containing the circuit of FIG. 3 and additional resistor arms with corresponding transistors. Resistor 665 (fifth resistor) can be connected in parallel with resistor 360 by the activation of the appropriate one of control signals 602P and 602N that respectively control the ON or OFF state of transistors 620 and 625. Similarly, resistor 685 (sixth resistor) can be connected in parallel with resistor 380 by the activation of the appropriate one of control signals 604P and 604N that respectively control the ON or OFF state of transistors 640 and 645. Control signal 605 controls the ON or OFF state of each of transistors 650 and 655. The values of resistors 665 and 685 are respectively different from those of resistors 350 and 355, and may be selected to provide a desired level of output logic-level swing. The operation of circuit block 690 is identical to that of circuit block 680 described above with respect to FIG. 3, and the description is not repeated here in the interest of conciseness. In operation, depending on the degree of output logic-level swing required, only one of circuit blocks 680 and 690 is operational. The other circuit block is disabled by switching OFF all the transistors in that circuit block. More number of selectable levels of logic-level swings may be provided similarly by addition of blocks similar to block 690. Switches 620, 625, 650, 655, 640 and 645 are referred to herein as a 'first set of switches'.

Since the technique or circuit of FIG. 3 enables power-efficient realization of multiple output logic-level swings without the need for different power supplies to be provided on path 301 (power supply 301 being typically implemented as an on-chip low-drop-out voltage regulator (LDO)), power supply 301 can be provided to each of logic block 130 and driver 140, thereby thus obviating the need for a separate LDO or power supply generator for driver 140.

Figure 5:
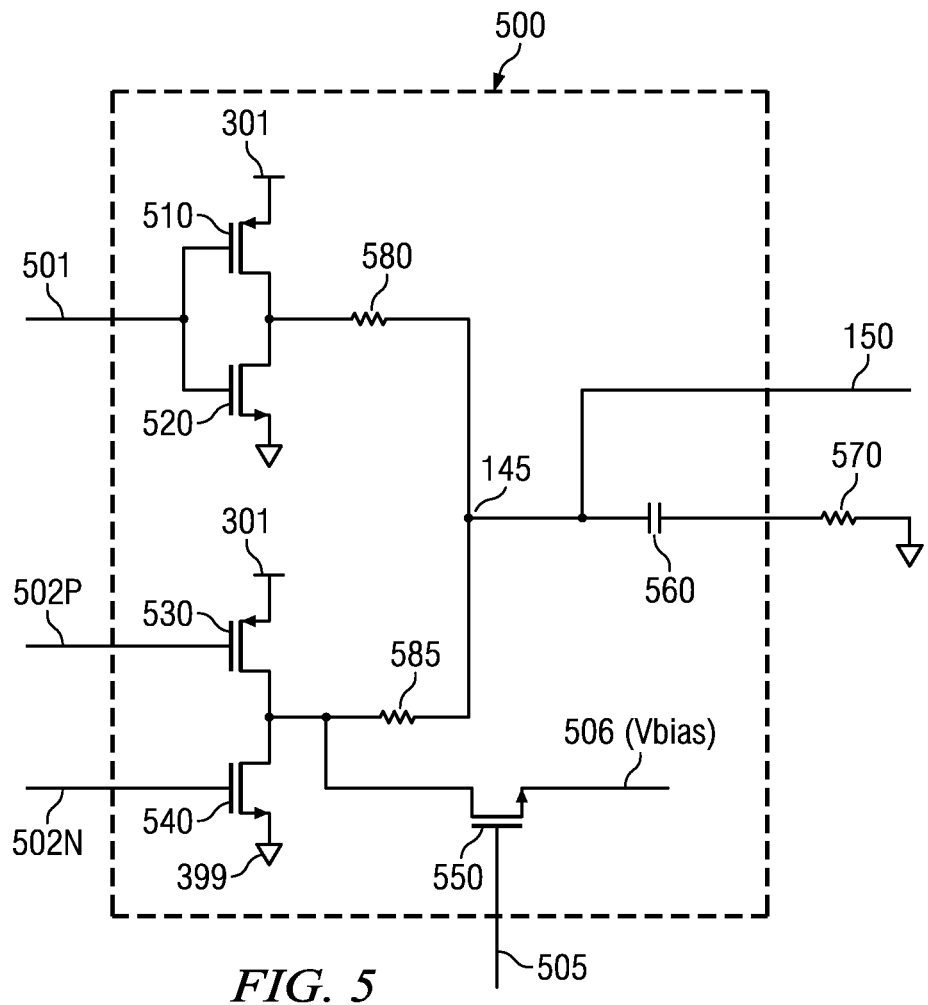
FIG. 5 is a circuit diagram of a driver designed to provide an ac-coupled single-ended output, in an embodiment.

FIG. 5 is a circuit diagram of a driver designed to provide an ac-coupled single-ended output, in an embodiment. Driver 500, which can be implemented in place of driver 140 of FIG. 1, is shown containing transistors 510, 520, 530, 540 and 550, resistors 580 and 585 and capacitor 560. Resistor 570 represents a terminating resistor, and is typically implemented at a receiver end. Terminal 506 is connected to a bias voltage Vbias. Capacitor 560 is used to ac-coupled output 145 to output path (transmission line) 150. Control signals 501, 502P, 502N and 505 are generated by on path 134 by logic block 130 (FIG. 1). Terminals 301 and 399 represent power supply and ground respectively.

When a pre-emphasized logic one is to be provided at node 145, control signal 505 is at logic low, and transistor 550 is OFF. Control signal 501 is at logic low, transistor 510 is ON, transistor 520 is OFF, and resistor 580 is connected between terminals 301 and 145. Control signal 502P and 502N are both at logic low, transistor 530 is ON, transistor 540 is OFF, and resistor 585 is connected between terminals 301 and 145. Resistors 380 and 385 are thus connected in a parallel arrangement between terminals 301 and 145. Values of resistances of resistors 380 and 385 may be selected such that the resistance of their parallel combination equals a desired output impedance.

When a logic one is to be provided in a steady-state, control signal 501 is at logic low, and resistor 580 is connected between terminals 301 and 145. Control signal 505 is at logic high, and transistor 550 is ON. Control signals 502P is at logic high, 502N is at logic low, and each of transistors 530 and 540 is OFF. Resistor 585 is connected between terminal 145 and 506 (Vbias). The output voltage across terminal 145 and 399 is lower in the steady-state mode than in the pre-emphasis mode. By appropriate selection (for example with a value of half of voltage 301) of voltage Vbias, power consumption in the steady-state mode can be reduced. To generate a logic low with pre-emphasis, control signals 501, 502P, and 502N are each at logic high, and control signal 505 is at logic low. To generate a logic low in steady-state, control signals 501 is at logic high, control signal 502P is at logic high, control signal 502N is at logic low, and control signal 505 is at logic high.

In the illustrations of FIGS. 1, 3 and 5, though terminals/nodes are shown with direct connections to various other terminals, it should be appreciated that additional components (as suited for the specific environment) may also be present in the path, and accordingly the connections may be viewed as being electrically coupled to the same connected terminals.

The circuit topologies of FIGS. 3, and 5 are merely representative. Various modifications, as suited for the specific environment, without departing from the scope and spirit of several aspects of the present disclosure, will be apparent to one skilled in the relevant arts by reading the disclosure provided herein. It should be appreciated that the specific type of transistors (such as NMOS, PMOS, etc.) noted above are merely by way of illustration. However, alternative embodiments using different configurations and transistors will be apparent to one skilled in the relevant arts by reading the disclosure provided herein. For example, the PMOS transistors may be replaced with NMOS transistors, while also interchanging the connections to power and ground terminals. Accordingly, in the instant application, power and ground terminals are referred to as constant reference potentials, the source (emitter) and drain (collector) terminals of transistors (through which a current path is provided when turned on and an open path is provided when turned off) are termed as current terminals, and the gate (base) terminal is termed as a control terminal.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A driver circuit comprising:
a plurality of switches operable, in response to a first set of values of a set of control signals, to couple:
a first resistor between a first one of a pair of differential output terminals of the driver circuit and a first one of a pair of constant reference potentials,
a fourth resistor between a second one of the pair of differential output terminals and a second one of the pair of constant reference potentials,
a second resistor in parallel with the first resistor, and a third resistor in parallel with the fourth resistor,
the plurality of switches operable, in response to a second set of values of the set of control signals, to couple:
the first resistor between the first one of the pair of differential output terminals and the first one of the pair of constant reference potentials,
the fourth resistor between the second one of the pair of differential output terminals and the second one of the pair of constant reference potentials, and
a series arrangement of the second resistor and the third resistor between the pair of differential output terminals,
wherein each of the first set of values and the second set of values specifies both a voltage level as well as a logic level with which an output signal of the driver circuit is to be generated across the pair of differential output terminals in response to an input signal of the driver circuit,
wherein the pair of differential output terminals is coupled to a transmission line,
wherein the voltage level across the pair of differential output terminals corresponding to the first set of values is greater than the voltage across the pair of differential terminals corresponding to the second set of values for a same logic level of the output signal,
wherein the first set of values corresponds to a pre-emphasis interval of operation of the driver circuit, and the second set of values corresponds to a steady-state interval of operation of the driver circuit.

2. The driver circuit of claim 1, wherein the pre-emphasis interval is an interval of one bit period immediately following a logic transition of the input signal, and
wherein, when there is no logic-level transition of the input signal for at least a two-bit duration, a steady-state interval exists, and is an interval from the start of the second bit in the at least two-bit duration and ending at a next logic-level transition of the input signal.

3. The driver circuit of claim 2, wherein a resistance of a parallel arrangement of the first resistor and the second resistor equals an output impedance of the driver circuit in each of the pre-emphasis interval and the steady-state interval.

4. The driver circuit of claim 3, wherein the set of control signals are generated by a logic block, wherein the first one of the pair of constant reference potentials receives a power supply, wherein the second one of the pair of constant reference potentials is a power supply return terminal, the power supply being generated by a low-dropout regulator (LDO), wherein the power supply generated by the LDO is used to power each of the driver circuit and the logic block.

5. The driver circuit of claim 1, wherein a power consumption of the driver circuit is directly proportional to the voltage level of the output signal.

6. The driver circuit of claim 1, further comprising a fifth resistor and a sixth resistor, and a first set of switches, the first set of switches and the plurality of switches operable to connect the fifth resistor instead of the second resistor in parallel with the first resistor, and the sixth resistor instead of the third resistor in parallel with the fourth resistor in the pre-emphasis interval,
the first set of switches and the plurality of switches operable to connect a series arrangement of the fifth resistor and the sixth resistor between the pair of differential output terminals instead of the series arrangement of the second resistor and the third resistor in the steady-state interval.

7. An integrated circuit (IC) comprising:
a processor to generate a binary value; and
a driver to receive a set of control signals specifying both a voltage level as well as a logic level with which an output signal representing the binary value is to be generated across a pair of differential output terminals of the IC, the driver comprising:
a plurality of switches operable, in response to a first set of values of the set of control signals, to couple:
   a first resistor between a first one of the pair of differential output terminals and a first one of a pair of constant reference potentials,
   a fourth resistor between a second one of the pair of differential output terminals and a second one of the pair of constant reference potentials, a second resistor in parallel with the first resistor, and a third resistor in parallel with the fourth resistor,
the plurality of switches operable, in response to a second set of values of the set of control signals, to couple:
   the first resistor between the first one of the pair of differential output terminals and the first one of the pair of constant reference potentials,
   the fourth resistor between the second one of the pair of differential output terminals and the second one of the pair of constant reference potentials, and a series arrangement of the second resistor and the third resistor between the pair of differential output terminals,
wherein the pair of differential output terminals is coupled to a transmission line,
wherein the voltage level across the pair of differential output terminals corresponding to the first set of values is greater than the voltage across the pair of differential terminals corresponding to the second set of values for a same logic level of the output signal,
wherein the first set of values corresponds to a pre-emphasis interval of operation of the driver circuit, and the second set of values corresponds to a steady-state interval of operation of the driver circuit.

8. The IC of claim 7, wherein the driver is comprised in a transmitter of the IC, wherein the transmitter comprises a logic block to receive the binary value and to generate the set of control signals in response.

9. The IC of claim 8, further comprising a low-dropout regulator (LDO) to generate a power supply on one of the pair of constant reference potentials, the power supply being used to power both the logic block and the driver.

10. The IC of claim 7, wherein a power consumption of the driver circuit is directly proportional to the value of the voltage level.

11. An integrated circuit (IC) comprising:
a processor to generate a binary value; and
a driver to receive a set of control signals specifying both a voltage level as well as a logic level with which an output signal representing the binary value is to be generated across a pair of differential output terminals of the IC, the driver comprising:
a plurality of switches operable, in response to a first set of values of the set of control signals, to couple:
   a first resistor between a first one of the pair of differential output terminals and a first one of a pair of constant reference potentials,
   a fourth resistor between a second one of the pair of differential output terminals and a second one of the pair of constant reference potentials, a second resistor in parallel with the first resistor, and a third resistor in parallel with the fourth resistor,
the plurality of switches operable, in response to a second set of values of the set of control signals, to couple:
   the first resistor between the first one of the pair of differential output terminals and the first one of the pair of constant reference potentials,
   the fourth resistor between the second one of the pair of differential output terminals and the second one of the pair of constant reference potentials, and a series arrangement of the second resistor and the third resistor between the pair of differential output terminals,
wherein the pair of differential output terminals is coupled to a transmission line,
wherein the voltage level across the pair of differential output terminals corresponding to the first set of values is greater than the voltage across the pair of differential terminals corresponding to the second set of values for a same logic level of the output signal,
wherein the first set of values corresponds to a pre-emphasis interval of operation of the driver circuit, and the second set of values corresponds to a steady-state interval of operation of the driver circuit, and
a fifth resistor and a sixth resistor, and a first set of switches, the first set of switches and the plurality of switches operable to connect the fifth resistor instead of the second resistor in parallel with the first resistor, and the sixth resistor instead of the third resistor in parallel with the fourth resistor in the pre-emphasis interval,
the first set of switches and the plurality of switches operable to connect a series arrangement of the fifth resistor and the sixth resistor between the pair of differential output terminals instead of the series arrangement of the second resistor and the third resistor in the steady-state interval.

12. The IC of claim 11, wherein the driver is comprised in a transmitter of the IC, wherein the transmitter comprises a logic block to receive the binary value and to generate the set of control signals in response.

13. The IC of claim 11, further comprising a low-dropout regulator (LDO) to generate a power supply on one of the pair of constant reference potentials, the power supply being used to power both the logic block and the driver.

14. The IC of claim 11, wherein a power consumption of the driver circuit is directly proportional to the value of the voltage level.

15. The driver of claim 11, wherein the pre-emphasis interval is an interval of one bit period immediately following a logic transition of the input signal, and
wherein, when there is no logic-level transition of the input signal for at least a two-bit duration, a steady-state interval exists, and is an interval from the start of the second bit in the at least two-bit duration and ending at a next logic-level transition of the input signal.

16. The driver of claim 15, wherein a resistance of a parallel arrangement of the first resistor and the second resistor equals an output impedance of the driver circuit in each of the pre-emphasis interval and the steady-state interval.

17. The driver of claim 16, wherein the set of control signals are generated by a logic block, wherein the first one of the pair of constant reference potentials receives a power supply, wherein the second one of the pair of constant reference potentials is a power supply return terminal, the power supply being generated by a low-dropout regulator (LDO), wherein the power supply generated by the LDO is used to power each of the driver circuit and the logic block.

18. The circuit of claim 11, wherein a power consumption of the driver circuit is directly proportional to the voltage level of the output signal.

* * * * *